US011840772B2

(12) United States Patent
Kolis et al.

(10) Patent No.: US 11,840,772 B2
(45) Date of Patent: Dec. 12, 2023

(54) HYDROTHERMAL METHOD FOR GROWTH OF ALKALINE EARTH METAL STANNATE BULK SINGLE CRYSTALS AND CRYSTALS FORMED THEREBY

(71) Applicant: CLEMSON UNIVERSITY, Clemson, SC (US)

(72) Inventors: Joseph W. Kolis, Clemson, SC (US); Rylan J. Terry, Clemson, SC (US); Colin D. McMillen, Clemson, SC (US)

(73) Assignee: Clemson University Research Foundation, Clemson, SC (US)

( * ) Notice: Subject to any disclaimer, the term of this patent is extended or adjusted under 35 U.S.C. 154(b) by 2 days.

(21) Appl. No.: 17/584,807

(22) Filed: Jan. 26, 2022

(65) Prior Publication Data

US 2022/0235488 A1   Jul. 28, 2022

Related U.S. Application Data

(60) Provisional application No. 63/141,663, filed on Jan. 26, 2021.

(51) Int. Cl.
*C30B 7/04*    (2006.01)
*C30B 29/22*   (2006.01)
*C30B 7/00*    (2006.01)

(52) U.S. Cl.
CPC .............. *C30B 29/22* (2013.01); *C30B 7/005* (2013.01); *C30B 7/04* (2013.01)

(58) Field of Classification Search
CPC ............ C30B 29/22; C30B 7/005; C30B 7/04
See application file for complete search history.

(56) References Cited

U.S. PATENT DOCUMENTS

| | | |
|---|---|---|
| 7,731,795 B2 | 6/2010 | Kolis et al. |
| 9,014,228 B1 | 4/2015 | Kolis et al. |
| 9,469,915 B2 | 10/2016 | Kolis et al. |
| 9,493,887 B1 | 11/2016 | Kolis et al. |
| 9,506,166 B1 | 11/2016 | Kolis et al. |
| 9,711,928 B2 | 7/2017 | Kolis et al. |
| 9,755,025 B2 | 9/2017 | Char et al. |
| 10,156,025 B2 | 12/2018 | Kolis et al. |
| 10,942,381 B2 | 3/2021 | Kolis et al. |
| 2019/0018301 A1 | 1/2019 | Kolis et al. |

FOREIGN PATENT DOCUMENTS

WO    WO2016153172 A1    9/2016

OTHER PUBLICATIONS

Shi et al., "Structural, Electronic and Elastic Properties of Cubic Perovskites SrSnO3 and SrZrO3 under Hydrostatic Pressure Effect" Chin. Phys. Lett. vol. 27, No. 9 (2010) 096201.*

(Continued)

*Primary Examiner* — Robert M Kunemund
(74) *Attorney, Agent, or Firm* — DORITY & MANNING, P.A (57) ABSTRACT

Hydrothermal methods for the synthesis of bulk crystals of alkaline earth metal stannates are described. Methods can be utilized for growth of large, single crystals of alkaline earth metal stannates including fully cubic $BaSnO_3$ and $SrSnO_3$.

23 Claims, 4 Drawing Sheets

(56) References Cited

OTHER PUBLICATIONS

Vegas et al "The ASnO3 (A = calcium, strontium) perovskites". Acta Crystallographica, Section B: Structural Science (1986), B42(2), 167-72 abs only.*

Ismail-Beigi et al., Alkaline earth stannates: The next silicon?, APL Materials, vol. 3, Issue 6, 062510, 2015, https://doi.org/10.1063/1.4921338.

Lee et al., Transparent Perovskite Barium Stannate with High Electron Mobility and Thermal Stability, Annual Review of Materials Research, vol. 47, 2017, pp. 391-423, https://doi.org/10.1146/annurev-matsci-070616-124109.

Terry et al., Hydrothermal growth of $BaSnO_3$ single crystals for wide bandgap applications, Journal of Crystal Growth, vol. 536, 125529, 2020, https://doi.org/10.1016/j.jcrysgro.2020.125529.

* cited by examiner

HYDROTHERMAL METHOD FOR GROWTH OF ALKALINE EARTH METAL STANNATE BULK SINGLE CRYSTALS AND CRYSTALS FORMED THEREBY

CROSS REFERENCE TO RELATED APPLICATION

This application claims filing benefit of U.S. Provisional Patent Application Ser. No. 63/141,663, having a filing date Jan. 26, 2021, which is incorporated herein by reference in its entirety.

STATEMENT REGARDING FEDERALLY SPONSORED RESEARCH OR DEVELOPMENT

This invention was made with government support under Grant No. N00014-18-1-2704, awarded by the Office of Naval Research. The government has certain rights in the invention.

BACKGROUND

There is a continuing interest, both theoretical and applied, in the perovskite-structured family of alkaline earth metal stannates as conducting oxides. For instance, barium stannate ($BaSnO_3$) shows great potential for such applications as it is one of the few ideally cubic (Pm-3m) perovskites, so its M-O orbitals overlap very effectively and its band structure displays an almost ideal orbital arrangement for n-doped conductivity. The conduction bands are widely dispersed with the density of states displaying a high percentage of tin 5s orbital structure, which is ideal for high mobility n-doped conducting electrons with low effective mass. Moreover, the bandgap of $BaSnO_3$ is marginally greater than 3 eV and appears to be a "slightly indirect gap," with the direct and indirect values being very close in energy.

Strontium stannate ($SrSnO_3$) is also of interest for electronic applications. The band structure of $SrSnO_3$ is likewise favorable for conductivity, but unfortunately, the crystal structure, as previously reported, is not conducive to conducting applications. The room temperature structural crystallography of $SrSnO_3$ has been found to have the aristotype structure, and investigation of single crystals have shown it to be generally cubic but with a unit cell doubled over the aristotype phase. In other studies, the compound was found to be orthorhombic in space group Pbnm, with the structure being derived from geometrical considerations due to the presence of heavy twinning. The nature of the twinning, studied by transmission electron microscopy, provided the first evidence for the likely existence of high-temperature structural phase transitions in $SrSnO_3$, and follow-up studies have confirmed the existence of the suspected structural phase transitions and have characterized the temperature dependence of the hettotype phases. However, studies have not described the existence of a fully cubic $SrSnO_3$, the existence of which would greatly improve its potential for application as a conducting oxide.

A major limitation to the full development of these materials in a variety of applications is the lack of suitable large bulk substrates. Initial work involving doped $BaSnO_3$ thin films fabricated via molecular beam epitaxy showed exceptional promise as a wide bandgap conducting oxide, but the preliminary work employed substrates of other materials such as $SrTiO_3$ with 2-5% lattice mismatch ("heteroepitaxy"). Such mismatch severely limits the performance of the material as it leads to significant defect density of the resulting films, especially threading dislocations. Further device development requires high quality defect-free films which, in turn, demands a bulk supporting substrate with a good lattice match, preferably having less than 1% lattice mismatch. Recent work led to the development of a range of new scandate pseudocubic perovskite substrates, but they are more exotic and not readily available, and are also of the "polar" variety of perovskite as opposed to "nonpolar" stannate materials.

Obviously, the best lattice-matched substrate for the growth of alkaline earth metal films would be a bulk single crystal of the same material ("homoepitaxy"). Growth of such materials is problematic primarily due to the instability of $Sn^{4+}$ at high temperatures. At the conditions normally required for the growth of refractory oxides, tetravalent tin oxide lattice tends to decompose and extrude oxygen, generating reduced valence tin and large numbers of lattice defects. To combat this problem, recent growth studies used reaction conditions around 1855° C. in an oxygen atmosphere (1-19 bar). This provided some growth but resulting materials had substantial impurities. Several groups also reported small (1-2 mm) crystals from some flux growth reactions, but the crystals invariably contained lattice impurities from the flux ions.

What are needed in the art are methods for forming high-purity single bulk crystals of alkaline metal stannates as may be utilized as homoepitaxial substrates in conductive as well as other applications. Moreover, high-purity single bulk crystals of such materials having previously unobtainable crystal structures would be of great benefit in the art.

SUMMARY

According to one embodiment, disclosed is a hydrothermal method for forming a bulk crystal comprising an alkaline earth metal stannate. A method can include heating and pressurizing an aqueous solution held within a reactor to develop a temperature differential between a first zone of the reactor and a second zone of the reactor, the aqueous solution containing a mineralizer, the first zone of the reactor containing an alkali earth metal source and an $Sn^{4+}$ source. Upon the heating and pressurizing, growth of a crystal comprising an alkaline earth metal stannate is initiated. For instance, a crystal can be a $BaSnO_3$ crystal or a $SrSnO_3$ crystal that is a single bulk crystal, optionally, including a small amount of one or more dopants (e.g., $La^{3+}$ for n-doping and $Ag^+$ for p-doping).

According to another embodiment, disclosed is a single bulk crystal comprising $SrSnO_3$, in which the $SrSnO_3$ has a fully cubic crystal structure.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

Disclosed are methods for the synthesis of bulk crystals of alkaline earth metal stannates. More specifically, disclosed methods incorporate a hydrothermal approach for growth of large, single crystals of alkaline earth metal stannates. Hydrothermal crystal growth techniques exhibit a number of attributes that make this particular approach attractive for the growth of bulk alkaline earth metal stannate crystals. For instance, the amphoteric nature of tin oxides makes them favorable for hydrothermal growth. Additionally, hydrothermal methods incorporate a fully sealed system during crystal growth and, as such, any O2 formed during growth will remain in the system and maintain the Sn$^{4+}$ oxidation state. In addition, through use of relatively low-growth temperatures (as compared to, e.g., flux or melt methods), the introduction of impurities and lattice defects can be minimized or eliminated in the disclosed methods.

Also disclosed are alkaline earth metal stannate crystals as may be formed according to disclosed methods. For instance, disclosed materials can be defect-free large crystals suitable for a variety of applications. In one embodiment, disclosed crystals can be beneficially utilized as bulk substrates for epitaxial thin-film growth, for instance, molecular beam epitaxy (MBE) thin-film growth.

Crystals described herein can have a cubic crystal structure (i.e., a Pm-3m space group) with the (110) and (100) faces on the as-grown crystals, which can be particularly beneficial in conducting applications.

Figure 2:
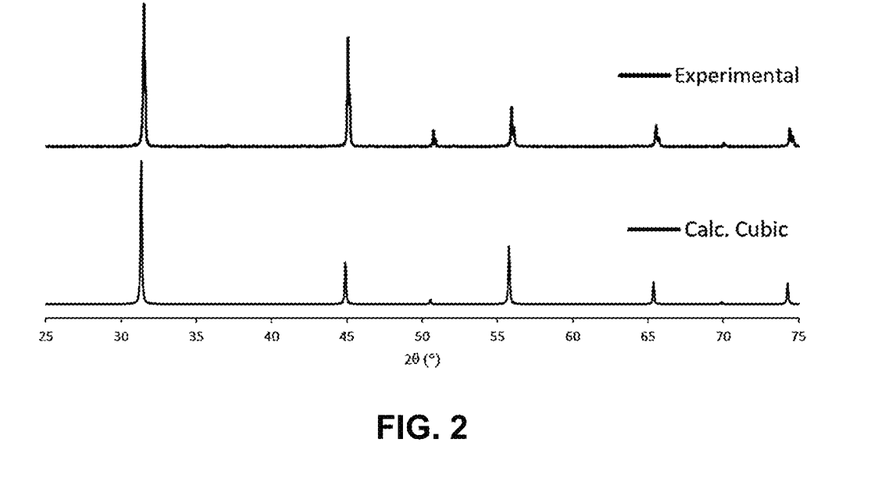
FIG. 2 compares the calculated and experimental x-ray diffraction data for fully cubic $SrSnO_3$ crystal formed as described herein.

In one embodiment, disclosed are fully cubic single, bulk SrSnO$_3$ crystals. Typically, SrSnO$_3$ crystals form in lower symmetry non-cubic space groups such as the orthorhombic Pnma space group SrSnO$_3$ crystals prepared by previously reported high-temperature (non-hydrothermal) methods. This has been a significant limitation in wider applications of SrSnO$_3$ crystals, as the lower symmetry structures have lower conducting orbital overlap, reducing the ultimate conductivity values of the doped materials. When prepared by the hydrothermal methods described herein, the cubic phase forms as single SrSnO$_3$ crystals. Without wishing to be bound by any particular theory, it is believed that the low temperatures and unique growth conditions of the disclosed hydrothermal methods are responsible for the cubic phase. The cubic phase is demonstrated by both single crystal and powder X-ray diffractions, the traditionally accepted structure determination methods (FIG. 2). Fully cubic SrSnO$_3$ crystals, as described herein, can have cubic space group Pm3-m and unit cells with all 90° angles. Table 1, below, provides additional characteristics of fully cubic SrSnO$_3$ crystals as disclosed herein.

TABLE 1

| | |
|---|---|
| Empirical Formula | SrSnO$_3$ |
| Formula weight, g/mol | 254.34 |
| Space group | Pm3-m |
| a, Å | 4.0366(3) |
| b, Å | |
| c, Å | |
| Volume, Å$^3$ | |
| Z | 1 |
| Density (calculated), g/cm$^3$ | 6.420 |
| Parameters | 6 |
| θ range, deg | 5.05-36.20 |
| Reflections | |
| Collected | 653 |
| Independent | 53 |
| Observed, I ≥ 2σ(I) | 53 |
| R, int | 0.0426 |
| Final R, obs. Data | |
| R1 | 0.0291 |
| wR2 | 0.0684 |
| Final R, all Data | |
| R1 | 0.0291 |
| wR2 | 0.0684 |
| Goodness of fit of F$^2$ | 1.259 |

Crystals formed according to disclosed methods can be both thermally and chemically stable. For instance, disclosed crystals can show high thermal stability with repeated heating and cooling cycles to 600° C. with no loss of conductivity or other negative effects. In addition, the formed materials can be readily polished for any of a variety of applications (e.g., as bulk substrates for subsequent epitaxial growth). Disclosed crystals can have positive solubility coefficients that increase with temperature and mineralizer concentration in the growth regimes. As such, disclosed crystals can be formed to have a predetermined solubility coefficient. In addition, disclosed crystals can have desirable band gap characteristics for conducting applications. For instance, the band gap for hydrothermally grown BaSnO$_3$ as described can be 2.94 eV as determined by use of the Tauc plot method, with an approximately 0.3 eV shift to higher energy upon n-doping. The band gap of a hydrothermally grown SrSnO$_3$ crystal as described can be about 4 eV or greater, making it very useful for high-power radio wave applications (e.g., microwave communications, high-power radar, and related).

The crystals can exhibit exceptionally high room temperature electron mobility (e.g., about 360 cm$^2$Ns), as well as a very small effective electron mass (e.g., about 0.3 me), with values that are comparable to the best classic wide bandgap conductors (e.g., SiC, GaN) and considerably better than other conducting oxides.

A hydrothermal growth method as described can provide for the formation of large monolithic single crystals. For instance, a monolithic single crystal can have both width and thickness dimensions (independently) of about 1 mm or greater, about 2 mm or greater, about 3 mm or greater, about 4 mm or greater, or about 5 mm or greater. As utilized herein, the term "single crystal" is intended to refer to a crystalline material that is substantially free of grain boundaries, e.g., that in one embodiment includes no internal grain boundaries. The crystals formed by this method can be sufficiently large to be polished and employed as substrates in molecular beam epitaxy, pulsed laser deposition, and other methods of epitaxial growth.

Figure 1:
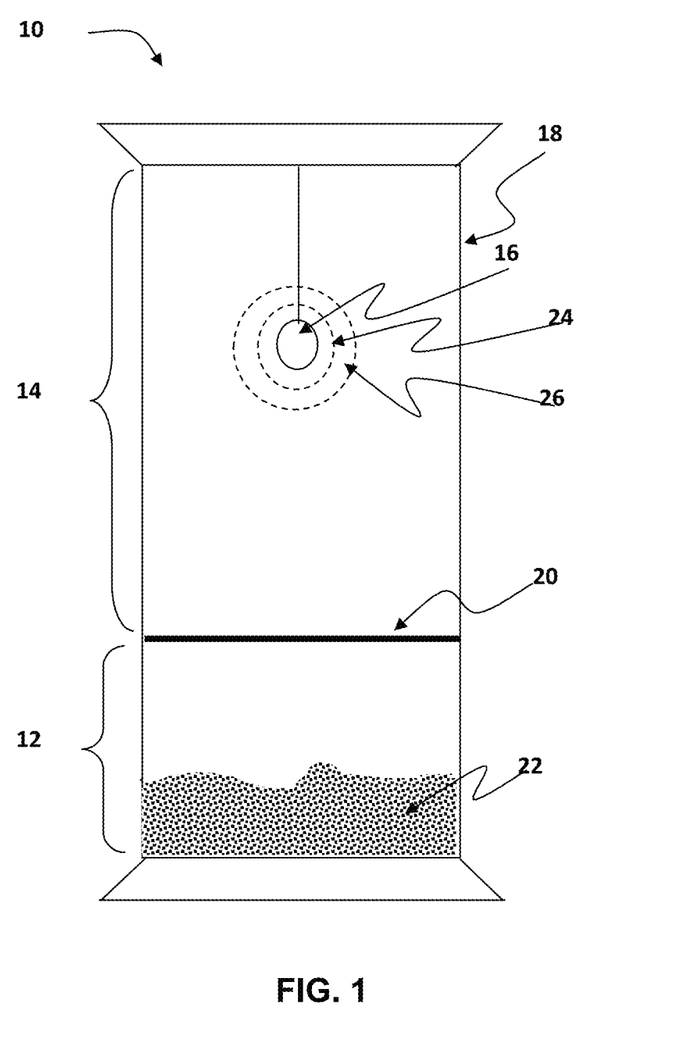
FIG. 1 schematically illustrates one embodiment of a hydrothermal growth system as may be utilized in forming a crystal as described herein.

FIG. 1 illustrates one embodiment of a hydrothermal system 10 as may be utilized in forming a single alkaline earth metal stannate crystal. In general, a hydrothermal process involves the use of a superheated aqueous solution (liquid heated above its boiling point) under pressure to cause transport of soluble species of one or more starting materials from a nutrient rich zone 12 to a supersaturated zone 14. As the starting material is not sufficiently soluble in the superheated water, the species will crystallize, either spontaneously according to primary nucleation, or alternatively, on a seed crystal 16 located in the supersaturated zone 14.

A process can generally take place within a reactor 18. Depending on the chemical demands of the specific system, a reactor 18 can be lined with a noble metal such as silver, gold, platinum, etc. In one embodiment, and as the tetravalent tin ions are somewhat aggressive toward inert metals such as silver and gold, longer growth runs as may be used in forming larger crystals (e.g., about 4 mm or greater in a cross-sectional dimension) can utilize a reactor 18 that includes a platinum liner to avoid contamination of the formed crystal from the liner materials.

A liner can be a fixed liner or a floating liner. A fixed liner reactor can be in the form of a stand-alone autoclave that is lined with or formed of a desired material and can carry the reactants, products, etc. When utilizing a floating liner, a smaller structure that is lined with or formed of the desired material (e.g., platinum) and containing the reactants can be held or suspended within a larger autoclave. For instance, an autoclave can contain a plurality of smaller reactors, e.g., silver or platinum tubes, each of which can be loaded with reactants, water, seed crystals, etc. and each of which can function as a floating liner reactor within a larger autoclave. Materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand-alone autoclave reactor that is either unlined or with a fixed liner can generally be between about 1 cm and about 10 cm in a cross-sectional dimension and between about 10 cm and about 100 cm in height. A floating liner reactor can generally be smaller; for instance, between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the wall of the reactor 18. For instance, when considering a silver- or platinum-lined or -floating reactor 18, baffle 20 can also be silver or platinum at least at the surface. Baffle 20 can define at least one aperture for passage of a solution from the nutrient rich zone 12 to the supersaturated zone 14. A baffle 20 can aid in maintaining a temperature differential between the two zones and can encourage substantially isothermal characteristics in each zone. Baffle 20 can also restrict convective flow between nutrient rich zone 12 and supersaturated zone 14 and can channel the convective flow across the baffle 20 into a desirable geometry.

System 10 can also include heaters, insulators, controllers, etc. as are generally known in the art (not shown on FIG. 1). For instance, a system 10 can include an air space between insulation and the reactor wall. There can also be vents at strategic places to allow air flow to be controlled. Changing vent parameters and power delivered to heaters can determine the thermodynamic condition of the autoclave. Additionally, though illustrated in a vertical arrangement with the nutrient rich zone 12 below the supersaturated zone 14, this is not a requirement of the disclosed process, and the two zones can be located in any suitable location with regard to one another, for instance in a horizontal or any other angled relationship, as long as a temperature differential between the two can encourage convective flow there between.

According to one embodiment, a seed crystal 16 of the desired stannate can be placed in the supersaturated zone 14 to facilitate crystallization of a dissolved feedstock 22 from a supersaturated solution. Alternatively, no seed crystal be employed, and the formation method can utilize spontaneous growth of single crystals as described. Such spontaneously nucleated crystals typically grow on the side or top of an inert metal lining within the supersaturated zone 14 of the hydrothermal reactor 18.

To form a crystal, a feedstock 22 can be located in the nutrient rich zone 12 of reactor 18. The feedstock can be selected based upon the crystal to be formed. For instance, in one embodiment, the system can be designed for formation of $BaSnO_3$ or $SrSnO_3$ crystals and the feedstock 22 can include microcrystalline powder, including any suitable barium or strontium source in combination with a source of tetravalent tin, $Sn^{4+}$. For instance, a barium hydroxide ($Ba(OH)_2$) powder or strontium hydroxide ($Sr(OH)_2$) powder can be located in the nutrient rich zone 12 in combination with a stannic oxide ($SnO_2$) powder.

The feedstock can be located in the nutrient rich zone in conjunction with other feedstock materials, which can vary depending upon the particular material to be formed. For instance, in one embodiment, a doped crystal can be formed, in which case the feedstock can include a suitable dopant source. By way of example, alkaline earth metal stannates can be readily n-doped with simple trivalent ions such as $La^{3+}$ on the alkaline earth metal site, and as such, formed crystals can accommodate a relatively high concentration of dopants (e.g., from about 0.01 at. % to about 5 at. %), in some embodiments. Further, p-doping can occur using, for example, monovalent Ag+ ions at the alkaline earth site, in concentrations similar to the n-dopants (e.g., from about 0.01 at. % to about 5 at. %).

When present, a dopant concentration in the formed crystal can be controlled through control of the relative amount of the dopant component present in feedstock materials initially located in the nutrient rich zone 12 of the reactor 18. For instance, when forming a lanthanum-doped crystal, inclusion of higher amounts of $La_2O_3$ powder in the nutrient rich zone 12 can attain a higher La doping level in the final crystal.

When included, a dopant can generally be provided in a feedstock in a concentration between about 0.01 at. % and about 5 at. %. The very precise control of dopant concentration in a formed crystal provided through feedstock content in the disclosed methods provides for excellent control of crystal characteristics including lattice size. Beneficially, by use of disclosed methods, dopant concentration can be maintained at a constant level throughout growth rather than at an everchanging concentration throughout growth as in some flux methods. Thus, the formed crystals can include a dopant at a desired and constant level throughout the crystal, which can provide an improved lattice structure and performance.

The feedstock 22 can be placed in the reactor 18 in conjunction with an aqueous solution. The aqueous solution used in the hydrothermal process can include a mineralizer that can facilitate dissolution and transport of the feedstock 18 from the nutrient rich zone 12 to the supersaturated zone 14. The identity and concentration of the mineralizer can be utilized to control and effect the hydrothermal growth method. Mineralizers are generally small molecules that can dissolve in the superheated fluid at the temperatures and pressures of a formation process and can assist in dissolving and transporting the feedstock from a source to nucleation sites where crystal growth can occur.

In forming alkaline earth metal stannate crystals, the mineralizer can, in one embodiment, include CsOH at a concentration of from about 0.5 to about 25 molarity (M); for instance, from about 1 M to about 5 M in some embodiments. The mineralizer can include CsOH in conjunction with one or more additional mineralizers including, without limitation KOH, LiOH, NaOH, RbOH, or mixtures thereof, with the total alkali metal hydroxide concentration in the aqueous solution being from about 0.5 M to about 30 M, and the CsOH concentration being from about 1 M to about 10 M in some embodiments.

The mineralizer can generally include any suitable material that can contribute one or more small ionic species to the system including, but not limited to, $OH^-$, $CO_3^{2-}$, $F^-$, $Cl^-$, $NO_3^-$ and $H^+$. Cations of a mineralizer can include, but are not limited to, alkali ions such as $Li^+$, $Na^+$, $K^+$, $Cs^+$ or $NH_4^+$. A mineralizer can optionally include one or more additional small soluble salt-generating anions and counter-cations.

During crystal formation, the superheated hydrothermal fluid can be contained in the reactor 18 under pressure; for instance, from about 50 MPa to about 200 MPa, typically between about 120 MPa and about 150 MPa; for instance, between about 130 MPa and about 145 MPa, such as about 140 MPa in some embodiments. Growth and supersaturation control are achieved in a process by the use of a differential temperature gradient across a reactor.

Referring again to FIG. 1, the nutrient rich zone 12 can be heated and feedstock 22 can dissolve in the hot hydrothermal fluid. The solution in the nutrient rich zone 12 can then become a saturated solution. The supersaturated zone 14 can be held at a slightly lower temperature. Consequently, the solution in the nutrient rich zone 12 can convect upward through the baffle 20 and into the supersaturated zone 14 where it will cool and become supersaturated. The dissolved feedstock can begin to come out of solution and build the crystal structure, either on a seed crystal 16 or spontaneously. The process can then continue until stopped or the feedstock supply is consumed.

Among the advantages of a hydrothermal crystal growth process are the relatively low operating temperatures. For instance, a growth process can generally be carried out with temperatures generally below about 750° C., for instance with temperatures within the reactor 18 ranging between about 600° C. and about 700° C.; for instance, from about 650° C. to about 680° C. This can simplify operating conditions and drastically minimize the amount of thermal strain regions of a forming crystal. The thermal gradient between the two zones 12, 14 of a reactor 18 can likewise vary according to specific materials and growth rates desired, but typically can be from about 10° C. to about 40° C.

The growth rate of a developing crystal can be between about 1 and about 5 microns per hour, or between about 30 and about 150 microns per day in cross-sectional dimensions. The growth rates possible can be beneficial as this can allow for precise control of the size of a forming crystal. For example, a process can reliably grow a region at about 2 microns/hour or about 25 microns/day and can thus be used to grow a region of about 100 microns over several days.

Disclosed methods can be readily scaled to form more than one crystal simultaneously, so time is not a hindering factor to a scale-up of a formation process. Moreover, once a process is started, it can require little or no operator input over the course of the reaction and can be replicated reliably many times. As such, the total time of growth can be of little consequence in the overall production process. Moreover, a hydrothermal process can be utilized to form crystals of various shapes, such as rods or disks, for instance depending upon the presence and shape of a seed crystal, as well as the specific formation parameters. Typically formed crystals can be several hundred microns to several millimeters in cross-sectional diameter, though larger or smaller materials can be formed. Beneficially, a hydrothermal method can be utilized for production of crystals in sufficiently large size so as to be able to be cut and, as such, can be useful for any of a variety of applications, and in one particular embodiment, for conductive applications.

Following formation, the as-formed crystal can be cut into a piece of the desired dimensions, and the faces thereof (not visible in FIG. 1) can be finished as desired; for instance, polished to a desirable flatness (e.g., flatness of about 3 nm or less) according to methods as are known in the art.

Disclosed methods can provide high-quality, fully cubic alkaline earth metal stannate single crystals. For instance, disclosed crystals can have rocking curves having FWHM values of 80 arcsec (0.0238°). Smaller crystals can have (110) faces that emerge, but over longer formation periods; these crystals are grown out in favor of the (100) faces. The doped materials can display low effective electron masses and high electron mobilities that can match the best values reported in the literature for bulk crystals.

While disclosed materials can be utilized in a variety of different applications, one particular embodiment may find use as a substrate for formation of MBE films as may be utilized in bandgap engineering to form a 2D electron gas (2DEG) that can display both unusual quantum effects as well as efficient device behavior.

The present disclosure may be better understood with reference to the Examples set forth below.

Example 1

Stoichiometric amounts of $Ba(OH)_2 \cdot H_2O$ (Aldrich, 98%) and $SnO_2$ (Alfa Aesar, 99.9%) powders were loaded into silver ampoules (⅜-inch o.d., 6-inch length) welded on one side. An aqueous mineralizer solution of 5 M CsOH (4 mL) was then added to the tube. A small crimp was applied at the center of the tube to serve as a baffle, and the open end of the tube was weld sealed. The ampoule was then placed in an autoclave with deionized water also added to the autoclave acting as a counterpressure to prevent the ampoule from rupturing. The autoclave was heated with a thermal gradient of 670-700° C., with the top of the autoclave body at the cooler zone to facilitate nucleation. The pressure in the autoclave while at operating temperature was 140 MPa (20 kpsi). After 14 days, the autoclave was cooled to room temperature and the synthesized $BaSnO_3$ crystals (about 2 mm to about 4 mm thickness and width dimensions) were collected and washed with deionized water. Growth experiments were also performed in gold and platinum ampoules, though these ampoules had a smaller diameter (0.2 inch) than the silver ampoules, ultimately limiting the size of the crystals that were obtained.

Synthesis of lanthanum-doped $BaSnO_3$ crystals was achieved using the same technique. For higher doping concentrations (1 at. % $La^{3+}$), $La_2O_3$ (Alfa Aesar, 99.999%) powder was added to the ampoule in amounts appropriate to the desired concentration. The amount of $Ba(OH)_2 \cdot H_2O$ powder was reduced in each reaction according to the doping concentration. In the synthesis of crystals having lower doping concentrations (0.1%), powders of $La_2O_3$ and $Ba(OH)_2 \cdot H_2O$ were thoroughly ground together to insure homogenous distribution of the dopant throughout the feedstock. This dry mixture was then added to the tube in a stoichiometric ratio with $SnO_2$. These reactions were heated under the same conditions as the undoped $BaSnO_3$.

Absorption edge measurements on the resulting crystals were performed using a Shimadzu UV-3600i Plus UV/Vis NIR Spectrometer measuring absorbance, and a Tauc plot was generated using this data. A Shimadzu IST-3100 Integrating Sphere accessory was used to approximate the band edge of both undoped and $La^{3+}$ doped samples using pulverized crystalline samples and measured against a $BaSO_4$ background. A rocking-curve ($\omega$) scan around the on-axis $BaSnO_3$ (002) reflection was measured using a Rigaku SmartLab® high-resolution thin film x-ray diffractometer to assess crystalline perfection. Silver ion p-doping concentration was measured using inductively coupled plasma-mass spectrometry (ICPMS) by Elemental Analysis, Inc. Approximately 0.25 g of sample was digested in a closed-vessel microwave unit at a temperature of 180° C. for 20 minutes using a combination of 3 mL concentrated nitric acid and 3 mL hydrogen peroxide. The sample was then analyzed by using a dilution of 1/400.

A solubility study was conducted using the weight loss method developed by Laudise (*Journal of Crystal Growth*, Volume 102, Issue 3, May 1990, Pages 427-433). For this study, single crystals of $BaSnO_3$ (approximately 2 mm³, 70 mg) were selected, weighed, and placed individually into silver ampoules (¼-inch od., 3-inch length). Aqueous CsOH of various concentrations was added in 0.4 mL portions to the ampoules. The ampoules were then welded shut and placed in an autoclave containing deionized water to serve as a counterpressure medium. The autoclave was heated to the desired temperature and pressure slowly vented as needed to maintain a constant pressure of 140 MPa at all temperatures across all experiments. Temperatures ranging from 575-700° C. and mineralizer concentrations from 1-5 M CsOH were used to investigate the solubility trends of $BaSnO_3$.

After reaching the desired temperature, the autoclaves were held isothermally for 24 hours, after which the heaters were turned off and the autoclaves allowed to cool to room temperature. Immediately upon opening, the individual crystals were weighed in order to determine their weight loss. Conversion of the data to a usable form was then performed using the formula:

wt. %=100($\Delta m/(m_{min}+\Delta m)$)

where $\Delta m$ is the mass loss of the crystal and $m_{min}$ is the mass of the mineralizer.

Figure 3:
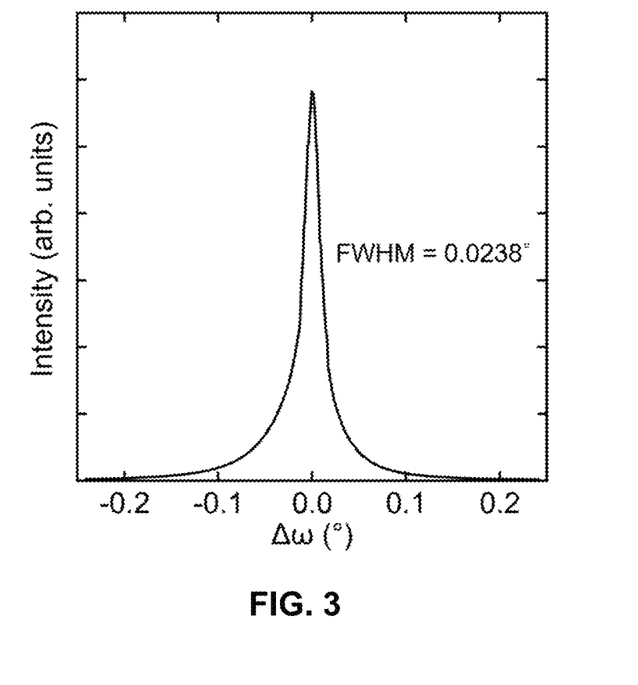
FIG. 3 provides a rocking-curve (ω) scan around the on-axis BaSnO$_3$ (002) reflection of a crystal formed as described herein.

Face-indexing of the crystals suggest that the {110} family of faces grew initially, with rhombohedrally-shaped faces predominating in the smaller (<1 mm) single crystals. As the crystals remained in the growth fluid for longer periods and grew larger, the desired {100} family of faces became apparent. Full single crystal data sets of multiple crystals indicated no discernable site disorder or defect sites within the lattice. Careful scans of several reflections show no evidence of shoulders or other crystalline imperfections. A rocking-curve ($\omega$) scan around the on-axis $BaSnO_3$ (002) reflection in these bulk crystals indicated a FWHM of 80 arcsecs (0.0238°), close to the limit of the instrument used (FIG. 3). Several high-resolution unit cell determinations gave sizes of 4.1168(2)-4.1182(2) Å, slightly larger than, though very close to, the conventional value of 4.116 Å.

Figure 4:
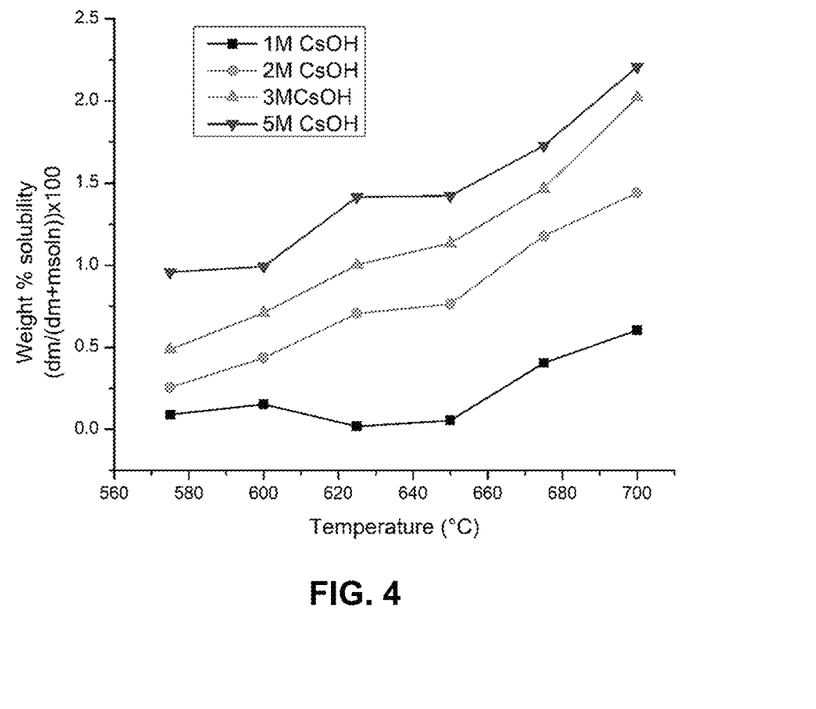
FIG. 4 provides a graph illustrating temperature dependence of the solubility of a BaSnO$_3$ crystal formed as described in the presence of CsOH mineralizer of various concentrations.
Figure 5:
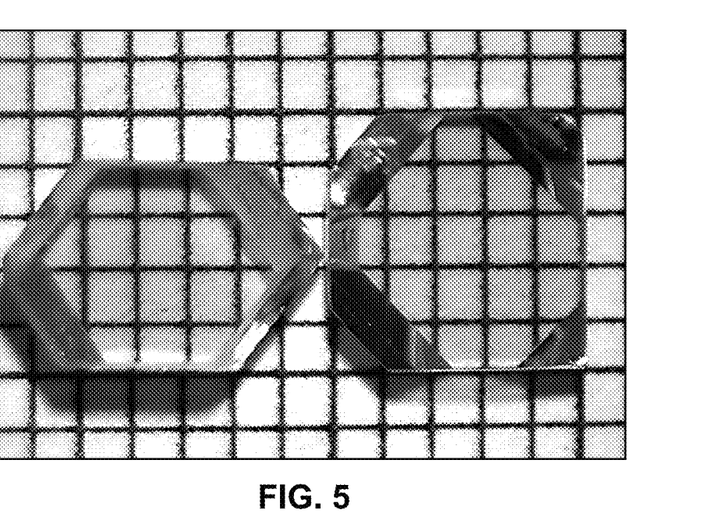
FIG. 5 illustrates polished BaSnO$_3$ single crystals formed according to disclosed methods with a dominant (110) face (left) and (100) face (right); grid size is 1 mm.

Determination of solubility curves using the protocol described by Laudise et al. indicated that $BaSnO_3$ also appears promising for large-scale transport growth (FIG. 4). It has positive solubility coefficients over the desired temperature range with modestly increasing solutions with respect to temperature and mineralizer concentrations. It is desirable to have values that increase moderately with temperature and mineralizer concentration as this generally makes it easy to find optimal conditions for transport, supersaturation, and growth of large crystals. Control of spontaneous nucleation over a 20° C. temperature gradient provided for formation of 5 mm-sized single crystals, in accordance with the solubility trends. Careful processing and mechanical polishing led to high-quality surfaces with <0.3 nm flatness (FIG. 5).

Figure 6:
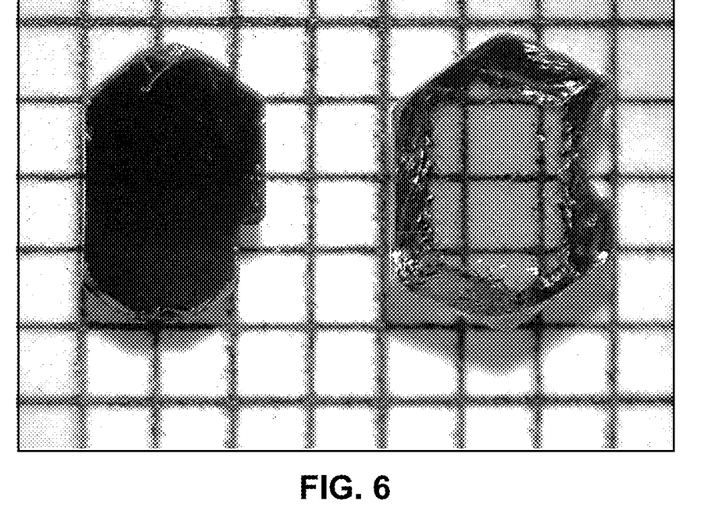
FIG. 6 illustrates doped. La:BaSnO$_3$ single crystals formed according to disclosed methods with polished (110) face; doping concentrations: 1.4×1020 e/cm$^2$ (left) and 1×1019 e/cm$^2$ (right); grid size is 1 mm.

Doping of $La^{3+}$ ion in the $Ba^{2+}$ site introduced a corresponding charge balancing electron in the conduction band. The $La^{3+}$ and corresponding carrier concentration was controlled between 3 at % dopant ($La_{0.03}Ba_{0.97}SnO_3$) and 0.01% at. % dopant ($La_{0.01}Ba_{0.99}SnO_3$). This generated a carrier concentration ranging from $5 \times 10^{20}$ e/cm² to $1.4 \times 10^{18}$ e/cm² and imparted a deep blue color to the material (FIG. 6). Interestingly, the electrons occupy bands consisting of significant amounts of Sn—O antibonding orbitals, which might be expected to increase the lattice size. This size increase was found to be generally counterbalanced by the replacement of the larger $Ba^{2+}$ ion with the smaller $La^{3+}$ ion and the linear increase in lattice parameters reported previously was not observed. Rather, no discernable or notable difference in lattice size was seen.

Figure 7:
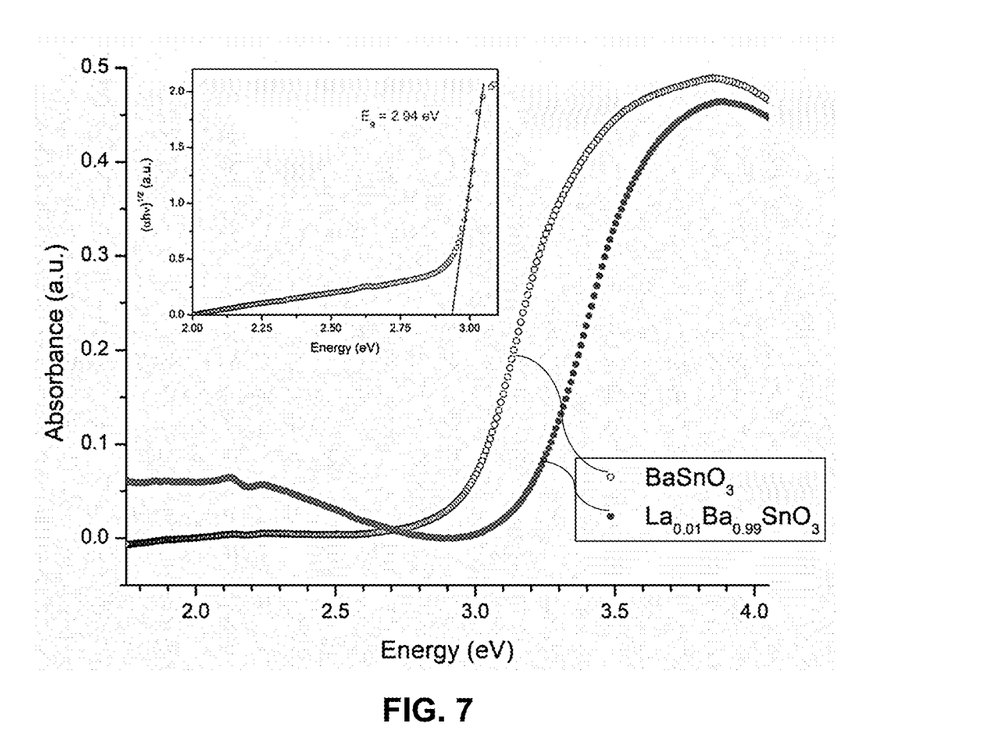
FIG. 7 illustrates the diffuse reflectance of undoped and lanthanum doped BaSnO$_3$ formed as described herein. The inset provides a Tauc plot of the undoped BaSnO$_3$ sample.

The band edge behavior in these materials was investigated by evaluation of a Tauc plot generated from the absorbance data (FIG. 7). The undoped material described above displayed an indirect band gap at 2.94 eV. In an initial study of the doped materials using diffuse reflectance measurements, the band edge was observed to shift somewhat, to approximately 3.3 eV at 1 at. % $La^{3+}$ doping, as might be expected. Burstein Moss measurements indicated that the effective electron mass could be calculated to be 0.35 me, which generally corresponds to the range of calculated and determined values. Similarly, initial Hall measurements at 0.07 at. % $La^{3+}$ doping indicated a carrier density of $1 \times 10^{19}$ e/cm² and a mobility value of 300 cm²/Vs at room temperature, which is among the highest measured values for these materials.

While certain embodiments of the disclosed subject matter have been described using specific terms, such description is for illustrative purposes only, and it is to be understood that changes and variations may be made without departing from the spirit or scope of the subject matter.

What is claimed is:

1. A method for forming a crystal comprising an alkaline earth metal stannate comprising:
   heating and pressurizing an aqueous solution held within a reactor to develop a temperature differential between a first zone of the reactor and a second zone of the reactor, the aqueous solution containing a mineralizer, the first zone of the reactor containing an alkaline earth metal source and a tetravalent tin source, wherein upon the heating and pressurizing, growth of a crystal comprising cubic alkaline earth metal stannate is initiated in the second zone of the reactor; and
   maintaining the heating and pressurizing within the reactor for a growth period to form a single crystal comprising the alkaline earth metal stannate, the single crystal defining a width that is about 1 mm or greater and a thickness that is about 1 mm or greater.

2. The method of claim 1, wherein the reactor comprises a liner comprising a noble metal.

3. The method of claim 2, wherein the noble metal is platinum.

4. The method of claim 1, wherein the alkaline earth metal source is a hydroxide of the alkaline earth metal.

5. The method of claim 1, wherein the alkaline earth metal comprises barium or strontium.

6. The method of claim 1, wherein the tetravalent tin source comprises stannic oxide.

7. The method of claim 1, further comprising locating a seed crystal comprising the alkaline earth metal stannate in the reactor prior to the heating and pressurizing.

8. The method of claim 1, wherein the mineralizer comprises cesium hydroxide at a concentration of from about 0.5 M to about 25 M.

9. The method of claim 1, the first zone of the reactor further comprising a dopant source.

10. The method of claim 9, wherein the dopant of the dopant source is a trivalent ion (n-doping).

11. The method of claim 10, wherein the dopant comprises lanthanum.

12. The method of claim 9 where the dopant of the dopant source is a monovalent ion (p-doping).

13. The method of claim 12, wherein the dopant comprises silver.

14. The method of claim 1, wherein the aqueous solution is pressurized to a pressure between about 50 MPa and about 200 MPa.

15. The method of claim 1, wherein the aqueous solution is heated to a temperature of about 750° C. or less.

16. The method of claim 1, wherein the temperature differential is from about 20° C. to about 40° C.

17. A single crystal comprising fully cubic strontium stannate, wherein the single crystal defines a width that is about 1 mm or greater and a thickness that is about 1 mm or greater.

18. The single crystal of claim 17, wherein the single crystal consists of the fully cubic strontium stannate.

19. The single crystal of claim 17, further comprising a dopant.

20. The single crystal of claim 19, the dopant comprising a trivalent ion.

21. The single crystal of claim 20, the dopant comprising lanthanum.

22. The single crystal of claim 19, the dopant comprising a monovalent ion.

23. The single crystal of claim 22, the dopant comprising silver.

* * * * *